（12） United States Patent
Mende et al.

(10) Patent No.: US 9,793,661 B2
(45) Date of Patent: Oct. 17, 2017

(54) DIFFERENTIAL PIN TO RF ADAPTOR FOR PROBING APPLICATIONS

(71) Applicant: Tektronix, Inc., Beaverton, OR (US)

(72) Inventors: Michael J. Mende, Portland, OR (US); Gary W. Reed, Oakdale, CA (US); James D. Pileggi, Beaverton, OR (US); Karl A. Rinder, Beaverton, OR (US); Richard A. Booman, Lake Oswego, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 15/257,681

(22) Filed: Sep. 6, 2016

(65) Prior Publication Data

US 2017/0271828 A1   Sep. 21, 2017

Related U.S. Application Data

(60) Provisional application No. 62/310,159, filed on Mar. 18, 2016.

(51) Int. Cl.
*H01R 9/05* (2006.01)
*H01R 24/54* (2011.01)
*H01R 103/00* (2006.01)

(52) U.S. Cl.
CPC ....... *H01R 24/542* (2013.01); *H01R 2103/00* (2013.01); *H01R 2201/20* (2013.01)

(58) Field of Classification Search
CPC ............................ H01R 17/12; H01R 13/6392
USPC .................. 439/578, 582–585, 369, 352
See application file for complete search history.

(56) References Cited

U.S. PATENT DOCUMENTS

| 3,825,874 A * | 7/1974 | Peverill | H01R 24/568 |
| | | | 439/579 |
| 7,495,527 B2 * | 2/2009 | Ornt | H01P 1/125 |
| | | | 333/105 |
| 8,035,466 B2 * | 10/2011 | Payne | H01P 5/085 |
| | | | 333/260 |
| 2007/0222538 A1 * | 9/2007 | Ornt | H01P 1/125 |
| | | | 333/105 |
| 2010/0176896 A1 * | 7/2010 | Payne | H01P 5/085 |
| | | | 333/33 |

* cited by examiner

*Primary Examiner* — Phuongchi T Nguyen
(74) *Attorney, Agent, or Firm* — Marger Johnson; Kevin Dothager

(57) ABSTRACT

A differential pin to RF adaptor includes a center conductor contact with an RF connector on one end and a signal contact on the other end. An insulating sleeve surrounds the central contact. A reference contact surrounds the insulating sleeve. The signal pin of the differential pair interfaces with the center conductor contact of the RF connector. The adaptor is structured to slide down over a pair of pins/leads so that the reference contact abuts a circuit board attached to the pins. The pins/leads are shielded all the way to the circuit board, which shields/isolates the pins from common mode and other types of interference. The adaptor maintains the shape of the signal pin and the reference pin during testing. The adaptor maintains a fixed impedance of the pins, which reduces or eliminates uncontrolled impedance and hence preserves system frequency response and reduces/eliminates erroneous ripple currents.

13 Claims, 3 Drawing Sheets

DIFFERENTIAL PIN TO RF ADAPTOR FOR PROBING APPLICATIONS

CROSS-REFERENCES TO RELATED APPLICATIONS

The present application claims benefit to U.S. Provisional Patent Application Ser. No. 62/310,159, filed Mar. 18, 2016, and entitled "Square Pin to RF Adaptor For Probing Applications," which is incorporated herein by reference as if reproduced in its entirety.

FIELD OF THE INVENTION

This disclosure is directed to a mechanism for signal probing, and, more particularly, to an adaptor for interfacing from square or round pins/leads into a coaxial Radio Frequency (RF) connector for testing by a test and measurement system.

BACKGROUND

Various systems have been developed to measure differential signals from a device under test (DUT). There are a variety of ways to connect the test system to the DUT. These may include a soldered connection, RF connector, pressure contacts, wires/leads, pins, adapters, interposers, clip-ons etc. A common interface to connect the test system to the DUT is accomplished by using a pair of pins/short wires that are soldered to the differential test points, which are then connected to the test system. The problem with such systems is that ambient electric fields may interact with the exposed leads/pins, which lack shielding, injecting interference into the signals being measured. Interference injected into both leads/pins is referred to as common mode interference. The exposed leads/pins may experience both common mode interference and interference affecting the individual leads/pins. There is no mechanism to isolate the differential signal from these interferences at the exposed leads/pins, resulting in added signal noise that is measured by the testing system but is not present in the actual DUT's differential signal. Further, maintaining a uniform controlled impedance of these differential leads/pins supports repeatable measurements without degradation in the frequency response. However, real exposed leads/pins may bend and change position significantly during the testing process. Bending the exposed leads changes the corresponding impedances of the differential pair. Such uncontrolled impedances alter the frequency response of the signal at the testing system, leading to bandwidth loss and ripple currents. As such, the exposed leads reduce the accuracy of test measurements taken by a testing system, particularly when measuring a differential signal with higher frequency content.

Embodiments of the invention address these and other issues in the prior art.

SUMMARY OF THE DISCLOSURE

Embodiments of the disclosed subject matter include a differential pin to RF adaptor. The adaptor contains a central contact with an RF connector on one end and a signal contact on the other end. An insulating sleeve surrounds the central contact. A reference contact surrounds the insulating sleeve. Securing elements, such as leaf springs, are employed to engage the reference pin of a differential pair to the reference/shield contact. The signal pin of the differential pair interfaces with the central contact. A protective layer surrounds the securing elements and the reference contact. The adaptor is structured to slide down over the differential pair so that the outer reference/shield contact abuts a circuit board attached to the pins. In this way, the differential pins (e.g. leads) are completely shielded all the way down to the circuit board's surface, which shields/isolates the pins from common mode and other types of interference. Further, the adaptor's contact spacing is selected to match the pin spacing. As such, the adaptor maintains the shape of the signal pin and the reference pin during testing. Accordingly, the adaptor maintains a fixed/controlled impedance of the differential pair, which reduces or eliminates impedance variations and hence preserves system frequency response and reduces/eliminates erroneous ripple currents. The RF connector may be any type of RF connector desired to connect to a corresponding probe. In some embodiments, an attenuator is positioned between the RF connector and the signal contact. The attenuator reduces the gain associated with the differential signal to increase the input signal range of the test system. The attenuator in the adaptor allows for a broader range of RF connectors to be employed (e.g. RF connectors without pre-conditioning circuits).

Accordingly, in at least some embodiments a differential pin to RF adaptor includes a central contact with a proximate end and a distal end, the proximate end including an RF connector and the distal end including a signal contact structured to interface with a signal pin of a differential pair. The adaptor also includes an insulating sleeve surrounding the central contact. Further, the adaptor includes a reference/shield contact separated from the central contact by the insulating sleeve and structured to interface with a reference pin of the differential pair.

In another aspect, in at least some embodiments a differential pin to RF adaptor includes a central contact structured to communicate a signal portion of a differential signal from a distal end to a RF connector at a proximate end. The adaptor also includes a reference contact structured to communicate a reference portion of the differential signal from the distal end to the RF connector at a proximate end. Further, the adaptor includes an insulating sleeve structured to isolate the reference portion of the differential signal from the signal portion of the differential signal.

DETAILED DESCRIPTION

As described herein, the embodiments of the disclosure are directed to a differential pin to RF adaptor. The adaptor may be configured to attach to square or round pins, or short wire leads and interface from this differential pair to a testing system via a probe. The adaptor employs a center conductor contact structured to communicate a signal from a distal end to a RF connector at a proximate end. The adaptor also employs a reference contact structured to communicate a reference signal corresponding to the signal. Accordingly, the center conductor contact and the reference contact communicate the differential signal to the RF connector. The adaptor also employs an insulating sleeve structured to isolate the reference signal from the signal traversing the center conductor contact. The reference/shield contact is structured to shield the signal from common mode interference or other interference received between a circuit board of a DUT and the RF connector. The adaptor is also structured to maintain a constant coaxial connection between the RF connector, the reference connection, and the center contact pin to maintain a controlled impedance between the pins. In some embodiments the central contact further includes an attenuator structured to reduce a gain of the differential signal prior to communicating the differential signal to the RF connector at the proximate end in order to match the gain of the differential signal to an expected gain across an RF probe and/or electrically isolate the DUT from the test system. Securing elements are employed to maintain connection with the pins and a protective layer protects the adaptor, and the interfaced pins, from damage during use.

Figure 1:
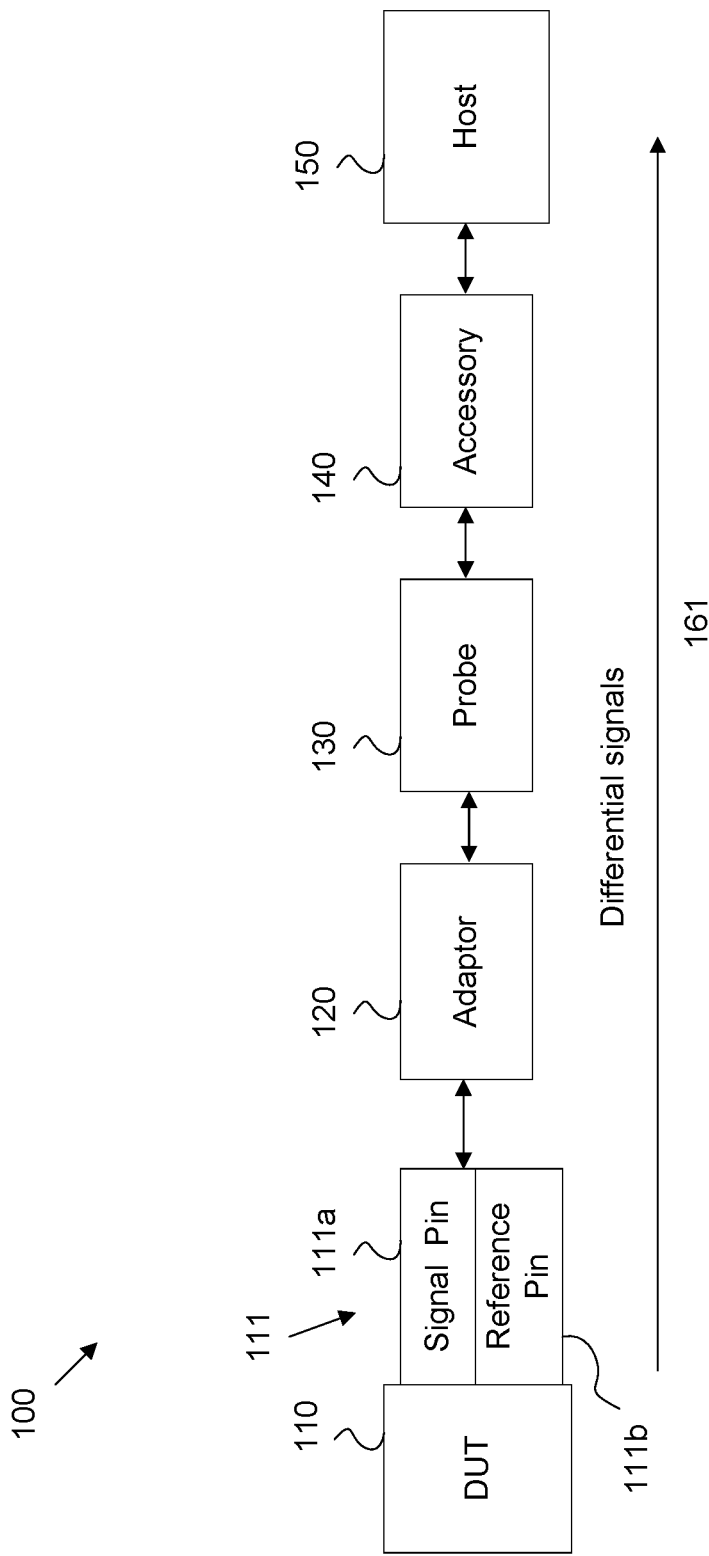
FIG. 1 is a schematic diagram of an embodiment of a test and measurement system.

FIG. 1 is a schematic diagram of an embodiment of a test and measurement system 100. System 100 includes a DUT 110 with a pair of differential pins 111. Differential signals 161 from the differential pins 111 are sent to the host 150 for testing. The differential signals 161 encode information as the difference between a signal traversing the signal pin 111a and a reference signal traversing the reference pin 111b. The host 150 is configured to receive differential signals 161, so an adaptor 120 conducts signals traversing the two pins/leads into a coaxial connection to be sent to the host 150. The differential signals 161 are sent to the host 150 via a probe 130 and, in some embodiments, an accessory 140 that acts a controller and/or pre-processor for the host 150.

A DUT 110 is any device structured to generate differential signals 161 for testing. For example, a DUT 110 may include a circuit board with any differential signals. These differential signals may be for transmission of data, controlling or biasing power supplies, high voltage signaling, or employed in other transmission systems etc. One of ordinary skill in the art will appreciate that a DUT 110 employing differential signaling encompasses a wide range for devices and the examples provided herein are included for purposes of explanation and should not be considered limiting. The DUT 110 includes differential pair 111 which are a pair of output pins that can be used to tap into the differential signal in the DUT 110 for testing purposes. The differential pair 111 include a signal pin 111a and a reference pin 111b. The differential signal 161 is a signal encoded as the difference between the signal traversing the signal pin 111a and the reference signal traversing the reference pin 111b.

Adaptor 120 is a differential pin to RF adaptor and is hence a device structured to interface between the pins/leads from the DUT's test points and a controlled impedance coaxial connection. Adaptor 120 is structured to interface with the pins/leads of differential pair 111 and transmit the differential signal 161 to probe 130. Specifically, adaptor 120 includes a pair of contacts that connect to an RF connector. The RF connector is selected to interface with the probe 130. The central contact of the adapter 120, which connects to the signal pin 111a, is connected to the center pin contact of the RF connector. Further, the adaptor 120 includes a reference contact, which connects to the reference pin 111b, and is connected to the outer shield contact of the RF connector. The adaptor 120 is further structured to abut the DUT 110 when interfacing with the differential pair 111 in order to shield/isolate the differential signals 161 from common mode or other ambient electrical interference occurring between the DUT 110 and the RF connector. The adaptor 120 is further structured to provide physical support for the differential pair 111. Specifically, the adaptor 120 maintains the differential pair 111 in a controlled position relative to each other and relative to RF connector and a corresponding coaxial connection, causing the entire connection to maintain a controlled impedance. The adaptor 120 may also include securing elements structured to secure reference pin 111b to the reference contact and/or to secure the signal pin 111a to the central contact. The adaptor 120 also includes a protective layer structured to protect the adaptor 120 and the coupled differential pair 111 during use. The adaptor 120 may or may not be soldered to the differential pair 111. The differential pair 111 may employ round or square pins or short wire leads, and the adaptor 120 is structured accordingly to engage with the pins/leads as needed. In some embodiments, the adaptor 120 includes an attenuator between the central and/or reference contacts and the RF connector to adjust the gain of the differential signals 161 to increase the acceptable input signal range and to better electrically isolate the DUT 110 system from the host 150.

Probe 130 is device structured to couple to adaptor 120 at the RF connector and communicate the differential signals 161 toward accessory 140. Probe 130 includes a coaxial cable with a probe RF connector to mate with the adaptor's RF connector. Specifically, probe 130 contains a coaxial cable with a center conductor and an outer shield. Probe 130 may also be constructed using a twisted pair and may be shielded. In some embodiments, the probe 130 includes an attenuator (e.g. if adaptor does not employ an attenuator). Further, the probe 130 includes a plurality of magnetic elements (e.g. ferrites) surrounding the coaxial cable and spaced along the length of the cable. The ferrites reject common mode interference. The magnetic elements are separated by gaps, which are filled with elastomeric elements. The elastomeric elements are compressible, which allows the probe to bend and prevent adjacent magnetic elements from pressing together (e.g. reducing wear and preventing stress fractures). The probe 130 is structured to couple to, and propagate the differential signals 161 to accessory 140. In some embodiments, the probe 130 also includes an Electrically Erasable Programmable Read Only Memory (EEPROM) containing probe 130 specifications, for example the resistance in the probe tip, tip attenuation, frequency response, and/or other parameters specific to probe 130.

Accessory 140 is any device structured to sense and/or precondition the differential signals 161 for host 150. The accessory 140 may include a sensor head for sensing the differential signals 161, a controller for preconditioning the differential signals 161, or combinations thereof. For example, the accessory 140 may obtain information from the EEPROM to adjust the gain of the signals 161 to compensate for power loss naturally occurring when the differential signals 161 traverse the probe 130. Accessory 140 is designed to deliver the differential signals 161 to the host 150 while maintaining substantially the same electrical properties as the differential signals 161. Specifically, the accessory 140 is designed to minimize noise injected into the signals 161 while traversing the differential pair 111, adaptor 120, and probe 130.

Host 150 is structured to couple to accessory 140 and receive the signals 161 for testing and/or measurement. For example, host 150 is an oscilloscope or other test system. Host 150 receives the differential signals 161 from the accessory 140 and may display them on a graticule for a user. Host 150 may also capture characteristics from the differential signals 161 in memory for further calculation and use by the user. Accordingly, the adaptor 120, probe 130, and accessory 140 are employed to allow the user to measure differential signals 161 that are substantially identical to the differential signals 161 obtained from the DUT 110.

Figure 2:
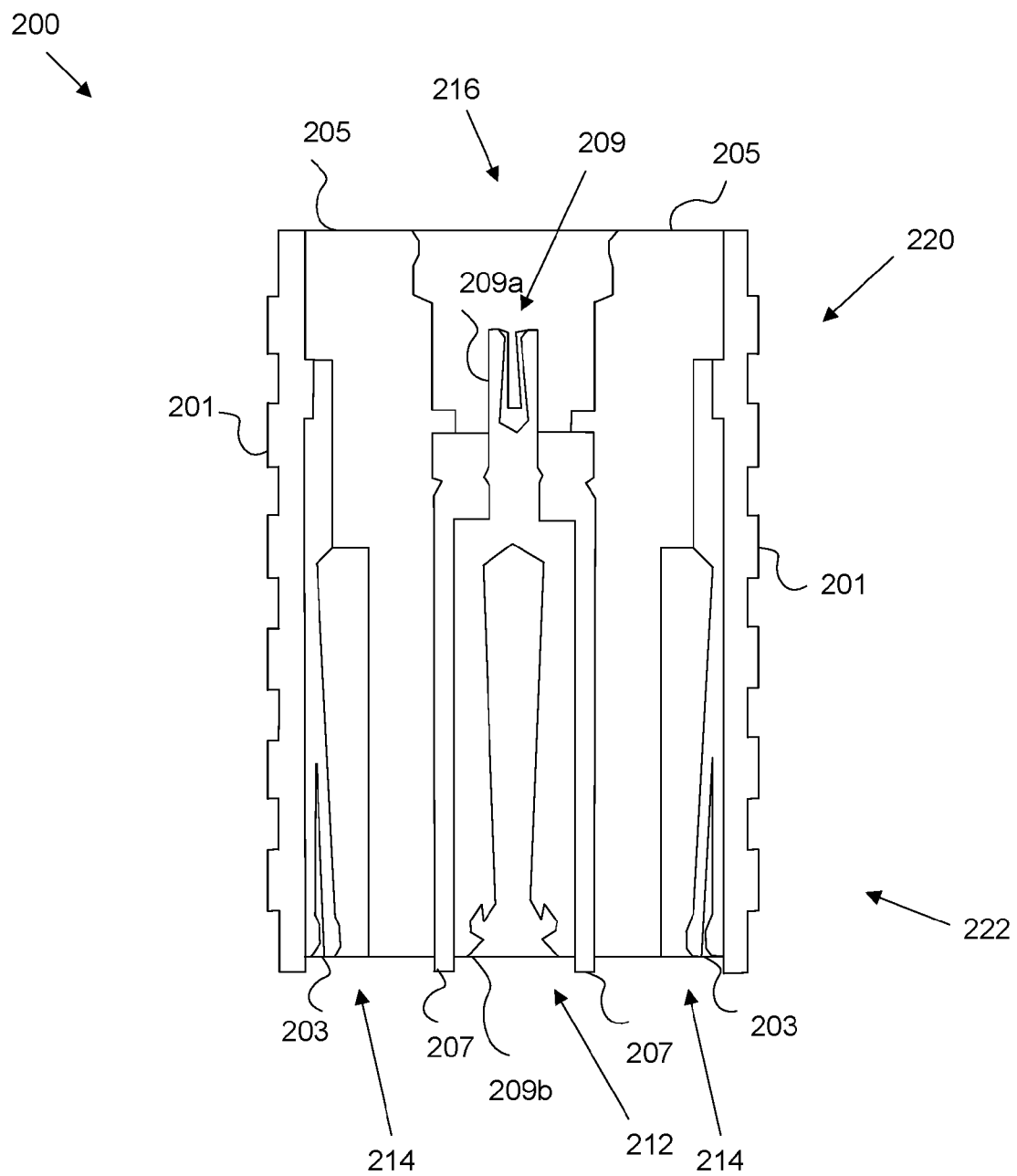
FIG. 2 is a cross sectional view of an embodiment of a differential pin to RF adaptor.

FIG. 2 is a cross sectional view of an embodiment of a differential pin to RF adaptor 200, which is substantially similar to adaptor 120. Adaptor 200 includes a center conductor contact 209 with an RF center contact 209a and a signal contact 209b. For clarity of discussion, the portion of the adaptor 200 depicted at the top of FIG. 2 is referred to herein as the proximate end 220, while the portion of the adaptor 200 depicted at the bottom of FIG. 2 is referred to as the distal end 222. It should be noted that the terms proximate and distal are relative labels employed for the purpose of discussing component position and should not be considered limiting. Accordingly, the proximate end 220 of the center conductor contact 209 includes the RF center contact 209a and the distal end 222 of the center conductor contact 209 includes the pin/lead signal contact 209b. The RF connector on end 220 may be any type of RF connector desired to couple to a corresponding RF probe, such as probe 130. For example, the RF connector on the end of 220 may be a Sub-Miniature Push-On (SMP) connector, a Sub-Miniature version A (SMA) connector, an Micro-Miniature Coaxial (MMCX) connector, or any other coaxial connector. The signal contact 209b is structured to receive and interface with a signal pin, such as signal pin 111a. Specifically, the signal contact 209b includes an opening 212 that receives and engages the signal pin/lead. The center conductor contact 209 may be made of any material capable of conducting electrical signals from the distal end 222 to the proximate end 220 and vice versa, for example copper, copper plated steel, brass, gold, gold plated brass, etc. The center conductor contact 209 is therefore a device that is structured to communicate a signal portion of a differential signal from the signal pin engaged at signal contact 209b at the distal end 222 to the RF center contact 209a at a proximate end 220.

The center conductor contact 209 is surrounded by an insulating sleeve 207. The insulating sleeve 207 is as an insulator/dielectric that keeps the center conductor contact 209 from shorting to the outer conductive shield acting as the reference contact 205. The insulating sleeve 207 may be made of any insulating material that provides the sufficient electrical insulation for the desired task, such as polyethylene, Polytetrafluoroethylene (PTFE) (e.g. Teflon), etc.

The center conductor contact 209 and the insulating sleeve 207 are surrounded by a layer of conductor acting as the reference contact 205. The reference contact 205 may be made of any conductive material, such as copper, copper plated steel, brass, gold, gold plated brass, etc. The reference contact 205 is separated and electrically isolated from the center conductor contact 209 by the insulating sleeve 207 and is structured to interface with the reference pin of the pins lead, such as reference pin 111b, at the distal end 222. Specifically, the adaptor 200 includes at least one opening 214 at the distal end to receive the reference pin in a manner that abuts the reference contact 205. While only one opening 214 is required to interface with the reference pin, multiple openings may be employed for ease of use. In a particular embodiment, four openings 214 are evenly spaced around the circumference of the adaptor 200, allowing the signal pin to engage with the signal contact 209b and the reference pin to be inserted into any of the openings 214. The spacing between openings 214 and 212 is selected based on the spacing of the differential pins the adaptor 200 is designed to interface with. The reference contact 205 is structured to abut the DUT at the distal end 222 of the adaptor 200. When abutting the DUT, the reference contact 205 physically contacts the DUT along an edge. By abutting the DUT, the reference contact 205 can shield the signal pin and the signal contact 209b, and hence the signal portion of the differential signal, from common mode or other interference received between the DUT and the RF connector 209a.

The adaptor 200 further includes one or more securing elements 203 structured to secure the reference pin of the differential pair to the reference contact 205 when the reference pin is inserted in the opening 214. For example, one securing element 203 is employed per opening 214. The securing element 203 may be any device that can releasably secure the reference pin in place. In the embodiment shown, a leaf spring is employed as the securing element 203. At the proximate end 220, the reference contact 205 forms an opening 216 that receives a probe RF connector that mates with RF center contact 209a. The opening 216 acts as part of the RF center contact 209a, allowing the signal portion of the differential signal to pass to a center of the probe RF connector from the center conductor contact 209 and the reference portion to pass to an outer portion of the probe RF connector. Accordingly, the reference contact 205 is a device that is structured to receive a reference pin and communicate the reference portion of the differential signal from the distal end 222 to the RF connector at the proximate end 220. Further, as discussed above, the insulating sleeve 207 can abut the DUT. By abutting the DUT with the insulating sleeve 207, and by securing the reference pin in opening 214 at a predetermine spacing relative to the signal pin, the adaptor 200 can maintain the signal pin in a parallel position relative to the reference pin to maintain a fixed impedance between the differential pair.

The adaptor 200 may further include a protective layer 201 surrounding the securing elements 203 and the reference contact 205, and hence also surrounding the insulating sleeve 207 and the center conductor contact 209. The protective layer 201 is an insulating jacket that protects the reference contact 205 from shorting to adjacent contacts or components on the DUT's surface. The protective layer 201 may be made of many materials suitable for such a purpose, for example polyvinyl chloride (PVC) or other plastics, rubber, etc.

Figure 3:
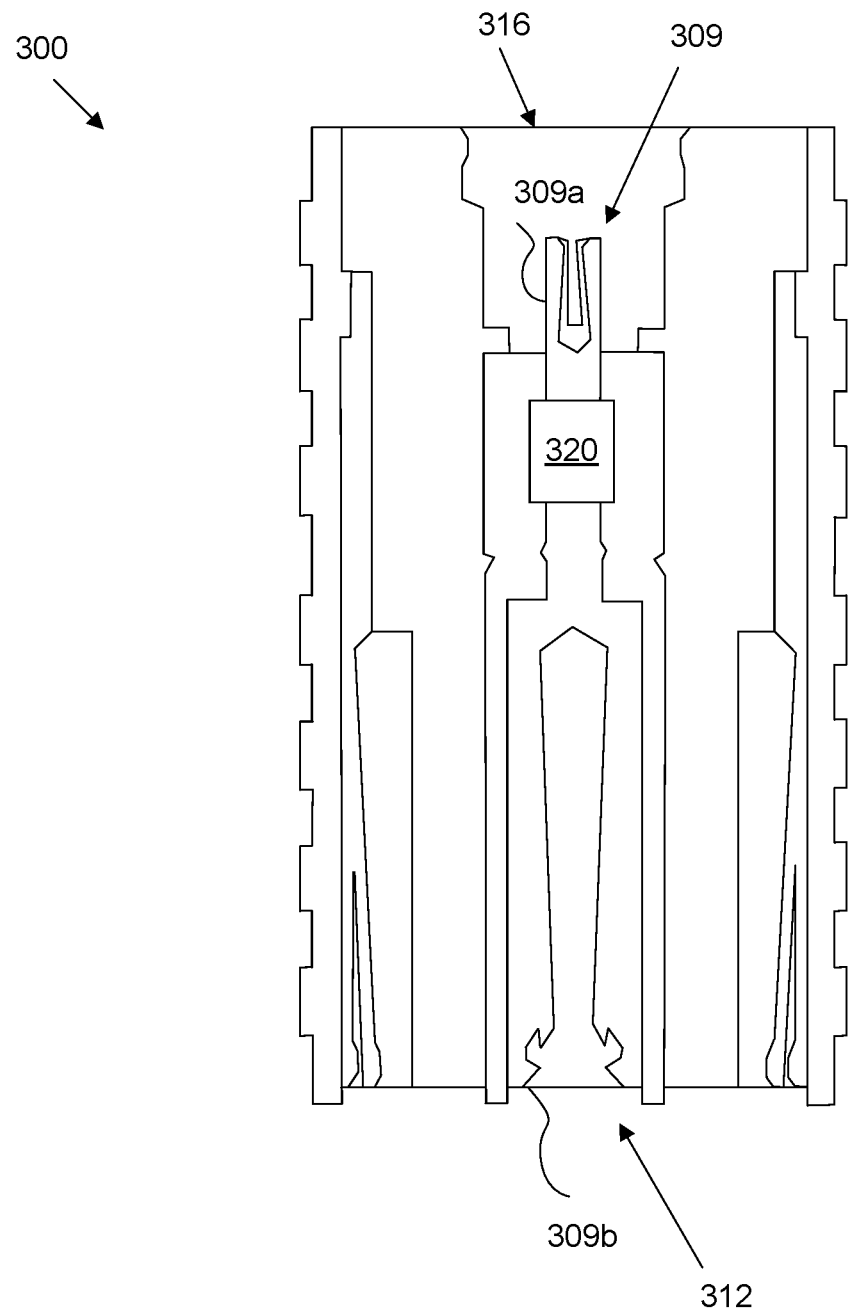
FIG. 3 is a cross sectional view of an embodiment of a differential pin to RF adaptor with a resistor network.

FIG. 3 is a cross sectional view of an embodiment of a differential pin to RF adaptor 300 with an attenuator 320. Adaptor 300 is substantially similar to adaptor 200, and hence only components interacting directly with the attenuator 320 are labeled in FIG. 3. Compared to adaptor 200, the central contact 309 is extended to insert the attenuator 320 between the signal contact 309b and the RF center contact 309a. The attenuator 320 is any resistive network structured to reduce a gain of a signal and/or match an impedance of a signal source to minimize power transfer between the source from the test network that is unrelated to the differential signal (e.g. minimize signal reflection from the test network, etc.) By employing an attenuator 320 in the central contact 309, a probe RF connector inserted into opening 316 need not include an attenuator for attenuation/isolation, allowing the probe to be constructed more cheaply and employ a wide variety of probe RF connectors. Functionally, the signal pin from the DUT is inserted into the signal contact 309b via opening 312 and the probe RF connector is inserted into RF center contact 309a via opening 316. The signal portion of the differential signal is communicated from the signal contact 309b to the RF center contact 309a via the attenuator 320. The attenuator employs a network of resistors that electrically reduce the gain of the differential signal received from the distal end of the adaptor 300 prior to communicating the differential signal to the RF center contact 309a at the proximate end in order to match the gain of the differential signal to an expected gain at the RF probe and electrically prevent erroneous power transfers between the DUT from the testing system (e.g. host 150) as discussed above.

The previously described versions of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. For example, where a particular feature is disclosed in the context of a particular aspect or embodiment, that feature can also be used, to the extent possible, in the context of other aspects and embodiments.

Also, when reference is made in this application to a method having two or more defined steps or operations, the defined steps or operations can be carried out in any order or simultaneously, unless the context excludes those possibilities.

Although specific embodiments of the invention have been illustrated and described for purposes of illustration, it will be understood that various modifications may be made without departing from the spirit and scope of the invention. Accordingly, the invention should not be limited except as by the appended claims.

We claim:

1. A differential pin to radio frequency (RF) adaptor comprising:
    a center conductor contact with a proximate end and a distal end, the proximate end including an RF connector and the distal end including a signal contact structured to interface with a signal pin of a differential pair;
    an insulating sleeve surrounding the center conductor contact; and
    a reference contact separated from the center conductor contact by the insulating sleeve and structured to interface with a reference pin of the differential pair, wherein the reference contact is structured to abut a device under test (DUT) to, at least in part, shield the signal pin and the signal contact from common mode interference received between the DUT and the RF connector.

2. The differential pin to RF adaptor of claim 1, wherein the reference contact is structured to abut the DUT to maintain the signal pin in a controlled position relative to the reference pin to maintain a fixed impedance between the differential pair.

3. The differential pin to RF adaptor of claim 1, wherein the center conductor contact further comprises an attenuator structured to reduce a gain of a signal received from the signal pin of the differential pair.

4. The differential pin to RF adaptor of claim 1, wherein the RF connector is a Sub-Miniature Push-On (SMP) connector, a Sub-Miniature version A (SMA) connector, or an Micro-Miniature Coaxial (MMCX) connector.

5. The differential pin to RF adaptor of claim 1, wherein the signal pin and the reference pin are square pins.

6. The differential pin to RF adaptor of claim 1, wherein the reference contact surrounds the insulating sleeve.

7. The differential pin to RF adaptor of claim 6, further comprising one or more securing elements structured to secure the reference pin of the differential pair to the reference contact.

8. The differential pin to RF adaptor of claim 7, further comprising a protective layer surrounding the securing elements and the reference contact.

9. A differential pin to radio frequency (RF) adaptor comprising:
    a center conductor contact structured to communicate a signal portion of a differential signal from a distal end to a Radio Frequency (RF) connector at a proximate end;
    a reference contact structured to communicate a reference portion of the differential signal from the distal end to the RF connector at a proximate end, wherein the reference contact is structured to, at least in part, shield the signal portion from common mode interference received between a device under test (DUT) and the RF connector; and
    an insulating sleeve structured to isolate the reference portion of the differential signal from the center conductor contact.

10. The differential pin to RF adaptor of claim 9, wherein the reference contact is structured to maintain a signal pin of the DUT in a controlled position relative to a reference pin of the DUT to maintain a fixed impedance between the pins.

11. The differential pin to RF adaptor of claim 9, wherein the center conductor contact further comprises an attenuator structured to reduce a gain of the differential signal received from the distal end prior to communicating the differential signal to the RF connector at the proximate end in order to match the gain of the differential signal to an expected gain at an RF probe.

12. The differential pin to RF adaptor of claim 9, further comprising one or more securing elements structured to secure a reference pin to the reference contact to communicate the reference portion.

13. The differential pin to RF adaptor of claim 12, further comprising a protective layer structured to protect the securing elements and the reference contact.

* * * * *